United States Patent
Cho et al.

(10) Patent No.: US 6,864,132 B2
(45) Date of Patent: Mar. 8, 2005

(54) METHODS OF FABRICATING INTEGRATED CIRCUIT GATES BY PRETREATING PRIOR TO OXIDIZING

(75) Inventors: Jun-Kyu Cho, Gwangju-shi (KR); Si-Young Choi, Gyeonggi-do (KR); Sun-Pil Youn, Seoul (KR); Sung-Man Kim, Seoul (KR); Ja-Hum Ku, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 7 days.

(21) Appl. No.: 10/373,005

(22) Filed: Feb. 24, 2003

(65) Prior Publication Data

US 2003/0224590 A1 Dec. 4, 2003

(30) Foreign Application Priority Data

May 31, 2002 (KR) .................................. 10-2002-30510

(51) Int. Cl.$^7$ .......................................... H01L 21/8234
(52) U.S. Cl. ........................................................ 438/197
(58) Field of Search .................................. 438/142, 197, 438/231, 257, 275, 297, 592, 618, 653

(56) References Cited

U.S. PATENT DOCUMENTS

| | | |
|---|---|---|
| 6,114,229 A | 9/2000 | Hause et al. |
| 6,284,634 B1 | 9/2001 | Rha |
| 6,573,583 B2 * | 6/2003 | Hokazono .................... 257/486 |

* cited by examiner

*Primary Examiner*—Kamand Cuneo
*Assistant Examiner*—Monica D. Harrison
(74) *Attorney, Agent, or Firm*—Myers Bigel Sibley & Sajovec

(57) ABSTRACT

Integrated circuit gates are fabricated by forming an insulated gate on an integrated circuit substrate, wherein the insulated gate includes a gate oxide on the integrated circuit substrate, a polysilicon pattern including polysilicon sidewalls, on the gate oxide, and a metal pattern on the polysilicon pattern. The insulated gate is pretreated with hydrogen and nitrogen gasses. The polysilicon sidewalls are then oxidized. The pretreating in hydrogen and nitrogen gasses prior to oxidizing can reduce growth in thickness of the gate oxide during the oxidizing and/or can reduce formation of whiskers on the metal pattern, compared to absence of the pretreatment.

18 Claims, 5 Drawing Sheets

METHODS OF FABRICATING INTEGRATED CIRCUIT GATES BY PRETREATING PRIOR TO OXIDIZING

RELATED APPLICATION

This application claims the benefit of Korean Patent Application No. 2002-0030510, filed May 31, 2002, the disclosure of which is hereby incorporated herein by reference in its entirety as if set forth fully herein.

FIELD OF THE INVENTION

This invention relates to integrated circuit fabrication methods, and more particularly to methods of fabricating integrated circuit gates.

BACKGROUND OF THE INVENTION

Integrated circuits are widely used in consumer, commercial and industrial applications. Many integrated circuits utilize large numbers of Field Effect Transistors (FET) to provide integrated circuit functionality. As is well known to those having skill in the art, an FET generally includes spaced apart source and drain regions in an integrated circuit substrate, and an insulated gate on the substrate therebetween.

As the integration density of integrated circuit devices continues to increase, the width of an insulated gate may decrease. This decrease in width may undesirably increase the resistance of the insulated gate. In order to decrease the resistance, it is known to form an insulated gate using a multilayer structure, including a metal layer that can have a small resistance. Accordingly, it is known to provide an insulated gate that comprises a gate oxide on an integrated circuit substrate, a polysilicon pattern including polysilicon sidewalls, on the gate oxide, and a metal pattern on the polysilicon pattern. The gate oxide can comprise silicon oxide, silicon oxynitride and/or other oxides, and may include other materials, as well.

FIGS. 1–3 are cross-sectional views illustrating conventional insulated gates during intermediate fabrication steps thereof. As shown in FIG. 1, an insulated gate 80 includes a gate oxide 20 on an integrated circuit substrate 10, such as a silicon semiconductor substrate, and a gate electrode 45 on the gate oxide 20. The gate electrode includes a polysilicon pattern 30 including polysilicon sidewalls 30a, and a metal pattern 40 on the polysilicon pattern 30. A metal nitride pattern 35 also may be provided between the polysilicon pattern 30 and the metal pattern 40. The metal pattern 40 may comprise tungsten, and the metal nitride layer pattern 35 may comprise tungsten nitride. The gate electrode may be formed by anisotropic etching, to pattern blanket layers that are formed on the substrate 10. As is well known, this etching may damage the polysilicon pattern 30 and/or the substrate 10.

Referring now to FIG. 2, it is known to at least partially cure the etching damage by performing a selective oxidation process, to thermally oxide the sidewalls 30a of the polysilicon pattern after the gate electrode 45 is formed. The selective oxidation process can be carried out under conditions that oxidize the polysilicon pattern 30, but do not oxidize the metal pattern 40 or the metal nitride pattern 35.

Unfortunately, this oxidizing may undesirably increase the thickness of the gate oxide 20. For example, Table 1 shows measured thickness of a gate oxide 20 after a selective oxidation process. In Table 1, the initial thickness of the gate oxide was 50 Å.

TABLE 1

| thickness of the gate oxide 20 (Å) | | | |
| --- | --- | --- | --- |
| line width of the gate (80 nm) | | line width of the gate (200 nm) | |
| $T_c$ (center) | $T_e$ (edge) | $T_c$ (center) | $T_e$ (edge) |
| 78 | 87 | 46 | 78 |

As shown in Table 1, for a relatively narrow gate (e.g., 80 nm), the thickness $T_c$ in the center of the gate increased to about 78 Å, and the thickness $T_e$ at the edge of the gate increased to about 87 Å. For a wide gate (e.g., about 200 nm), the center thickness $T_c$ did not increase, but the edge thickness $T_e$ increased to about 78 Å. These increases in thicknesses may be undesirable, because it may lead to an increased threshold voltage of the field effect transistor.

Moreover, the selective oxidation process may not completely prevent oxidation of the metal pattern 40. In particular, as shown in FIG. 3, crystal growth may occur from a surface of the metal pattern 40 in a subsequent thermal process when part of the metal layer pattern 40 becomes oxidized during the selective oxidation process. This crystal growth may form whiskers 99 that emerge from the metal pattern 40. These whiskers may lead to device failure.

SUMMARY OF THE INVENTION

Some embodiments of the present invention precede oxidizing the polysilicon sidewalls of an insulated gate by pretreating the insulated gate, to reduce growth in thickness of the gate oxide during the oxidizing and/or to reduce formation of whiskers on the metal pattern, compared to absence of the pretreating. In particular, integrated circuit gates may be fabricated, according to some embodiments of the present invention, by forming an insulated gate on an integrated circuit substrate, wherein the insulated gate includes a gate oxide on the integrated circuit substrate, a polysilicon pattern including polysilicon sidewalls, on the gate oxide, and a metal pattern on the polysilicon pattern. The insulated gate is then treated in an atmosphere comprising hydrogen and nitrogen gasses. The polysilicon sidewalls are then oxidized. It has been found, according to some embodiments of the present invention, that the treating in the atmosphere comprising hydrogen and nitrogen gasses prior to oxidizing can reduce growth in thickness of the gate oxide during the oxidizing and/or can reduce formation of whiskers on the metal pattern, compared to absence of the pretreatment.

Still other embodiments of the present invention treat the insulated gate in a first atmosphere comprising hydrogen and nitrogen gasses, and then treat the insulated gate in a second atmosphere comprising hydrogen and oxygen gasses. This two atmosphere treatment can reduce growth in thickness of the gate oxide during the treatment in the second atmosphere and/or reduce the formation of whiskers on the metal pattern, compared to absence of the treating the insulated gate in the first atmosphere comprising hydrogen and nitrogen gasses.

In any of the above embodiments, the insulated gate may also include a metal nitride pattern between the polysilicon pattern and the metal pattern. In any of the above embodiments, the metal pattern may comprise tungsten, and the metal nitride pattern may comprise tungsten nitride. In any of the above embodiments, the pretreating or treating in the atmosphere comprising hydrogen and nitrogen gasses may be performed at between about 100° C. and about 1200° C., between about 5 torr and about 1000 torr, and/or for between about 30 seconds to about 1000 seconds. Moreover, in any of the above embodiments, a hydrogen gas (H$_2$) flow of between about 0.1 standard liters/minute (slm) to about 100 slm and/or a nitrogen gas (N$_2$) flow of between about 0.1 slm to about 100 slm may be used. Also, in any of the above embodiments, the treating the insulated gate in the atmosphere comprising hydrogen and nitrogen gasses and the oxidizing the polysilicon sidewalls, may be performed in a single processing apparatus or in different processing apparatus. Finally, in any of the above embodiments, oxidizing the polysilicon sidewalls may take place without oxidizing the metal pattern.

DETAILED DESCRIPTION OF PREFERRED EMBODIMENTS

Figure 1:
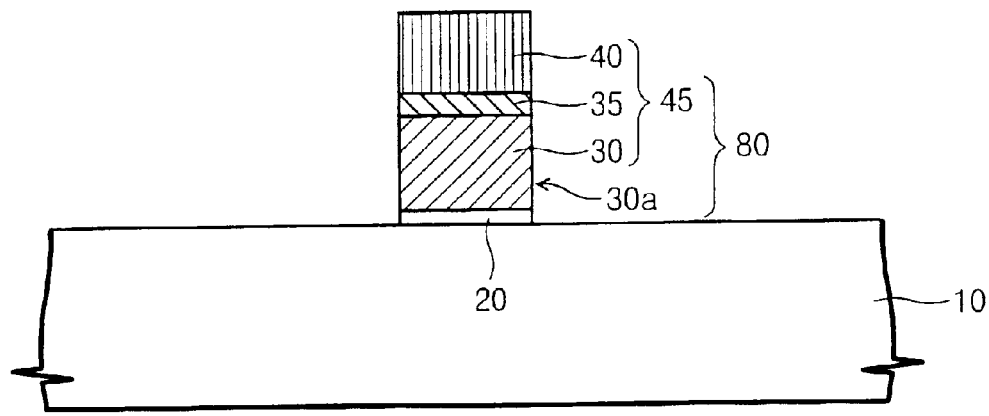
FIGS. 1–3 are cross-sectional views of conventional methods of fabricating integrated circuit gates during intermediate fabrication steps.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

Figure 4:
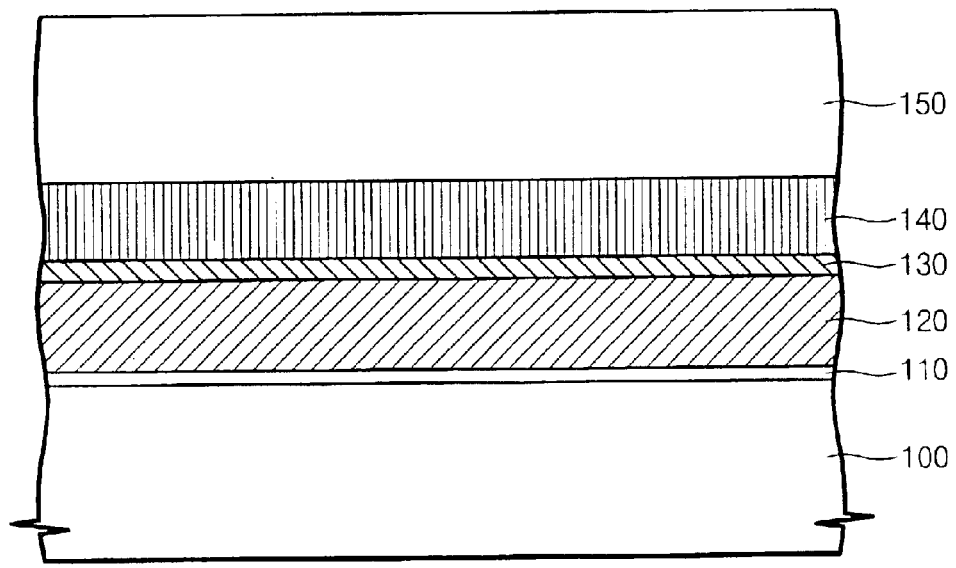
FIGS. 4–7 are cross-sectional views of methods of fabricating integrated circuit gates according to embodiments of the present invention during intermediate fabrication steps.

FIGS. 4–7 are cross-sectional views of methods of fabricating integrated circuit gates according to embodiments of the present invention during intermediate fabrication steps. Referring now to FIG. 4, an integrated circuit substrate 100, such as a silicon semiconductor substrate, is fabricated using conventional techniques. The integrated circuit substrate 100 may include source and drain regions, isolation regions and/or other conventional regions or features therein. In some embodiments, at least some of these regions or features may be formed after fabricating an integrated circuit gate according to embodiments of the present invention.

Still referring to FIG. 4, a gate oxide 110, a polysilicon layer 120, a metal layer 140 and a mask layer 150 are formed on the integrated circuit substrate using conventional techniques. As is well known to those having skill in the art, the gate oxide may be formed using a thermal oxidation process of the surface of the substrate 100. The gate oxide can comprise silicon oxide, silicon oxynitride and/or other oxides, and may include other materials as well. The metal layer 140 comprises tungsten in some embodiments. In other embodiments, the metal layer 140 may comprise titanium (Ti), tantalum (Ta), tungsten nitride (WN), titanium nitride (TiN), silicides of the above and/or other metals or metal compounds. Moreover, to reduce reaction between the metal layer 140 and the polysilicon layer 120, a metal nitride layer 130 may be formed between the polysilicon layer 120 and the metal layer 140 in some embodiments. The metal nitride layer 130 may comprise tungsten nitride (WN) in some embodiments. In other embodiments, titanium nitride (TiN) may be used. It is also known to perform a thermal process to stabilize the characteristics of the metal nitride layer 130 after its formation. The mask layer 150 may comprise silicon nitride in some embodiments. In other embodiments, silicon nitride, silicon oxide, silicon oxynitride and/or other conventional mask materials may be used.

Figure 5:
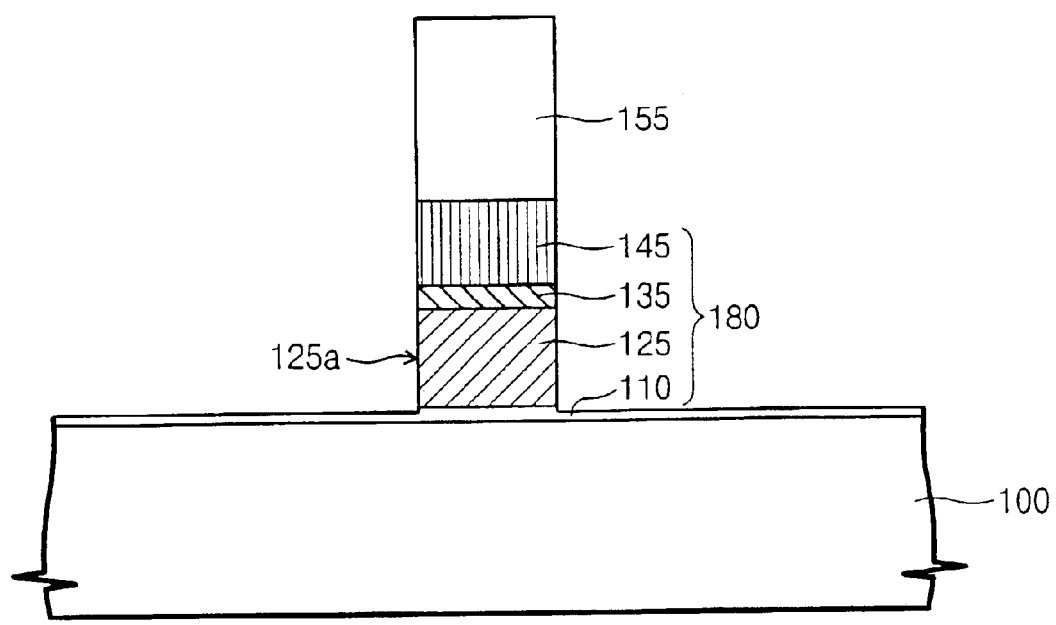

Referring now to FIG. 5, the mask layer 150 is patterned to form a mask pattern 155, for example using conventional anisotropic etching. Then, the metal layer 140, the metal nitride layer 130 and the polysilicon layer 120 may be etched to form an insulated gate 180 on the integrated circuit substrate, wherein the insulated gate 180 includes a gate oxide 110 on the integrated circuit substrate 100, a polysilicon pattern 125 including polysilicon sidewalls 125a, on the gate oxide 110, and a metal pattern 145 on the polysilicon pattern 125. A metal nitride pattern 135 also may be provided between the polysilicon pattern 125 and the metal pattern 135. The insulated gate 180 of FIG. 5 may be fabricated by performing an anisotropic etch process with an etch selectivity to the gate oxide 110. In some embodiments, this anisotropic etching is a plasma dry etching process. Conventionally, the dry etching process is followed by a selective oxidation process, to reduce etching damage that may be caused to the insulated gate 180 and/or the substrate 100. As was described above, this selective oxidation process may undesirably increase the thickness of the gate oxide 110 and/or allow whiskers to be formed on the metal pattern 145 during subsequent processing.

In sharp contrast, according to embodiments of the present invention, prior to oxidizing the polysilicon sidewalls 125a, the insulated gate 180 is treated in an atmosphere comprising hydrogen and nitrogen gasses. This treatment, also referred to as a pretreatment, can reduce the growth in thickness of the gate oxide 110 during the subsequent oxidizing and/or reduce formation of whiskers on the metal pattern 145, compared to absence of the pretreatment.

Figure 6:
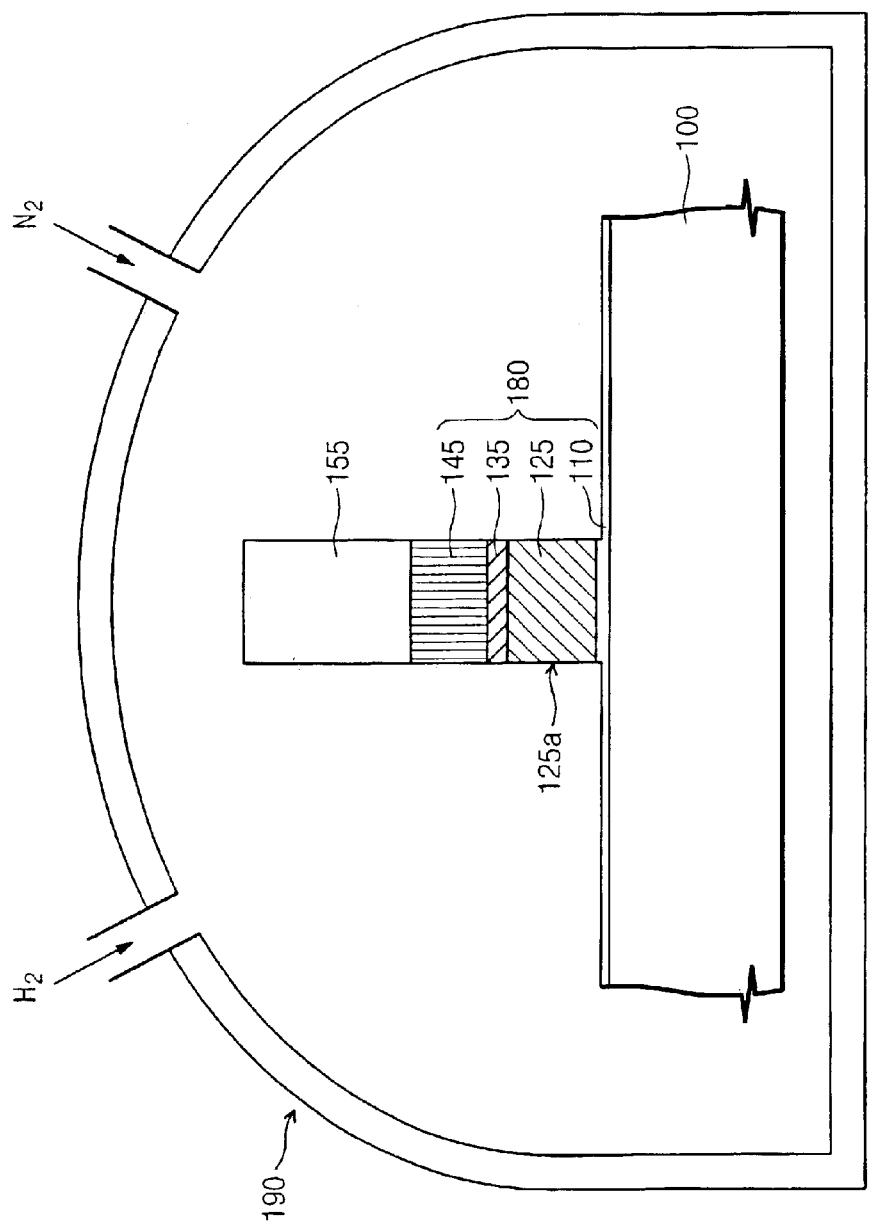

More specifically, referring to FIG. 6, the insulated gate 180 is treated in an atmosphere comprising hydrogen (H$_2$) and nitrogen (N$_2$) gasses in a treatment chamber 190, such as a conventional semiconductor processing chamber. In some embodiments, this treatment is performed at between about 100° C. and about 1200° C., at between about 5 torr to about 1000 torr and/or for between about 30 seconds and about 1000 seconds. In some embodiments, a hydrogen gas flow of between about 0.1 slm and about 100 slm and/or a nitrogen gas flow of between about 0.1 slm to about 100 slm may be used. Other gas flows also may be present.

Figure 7:
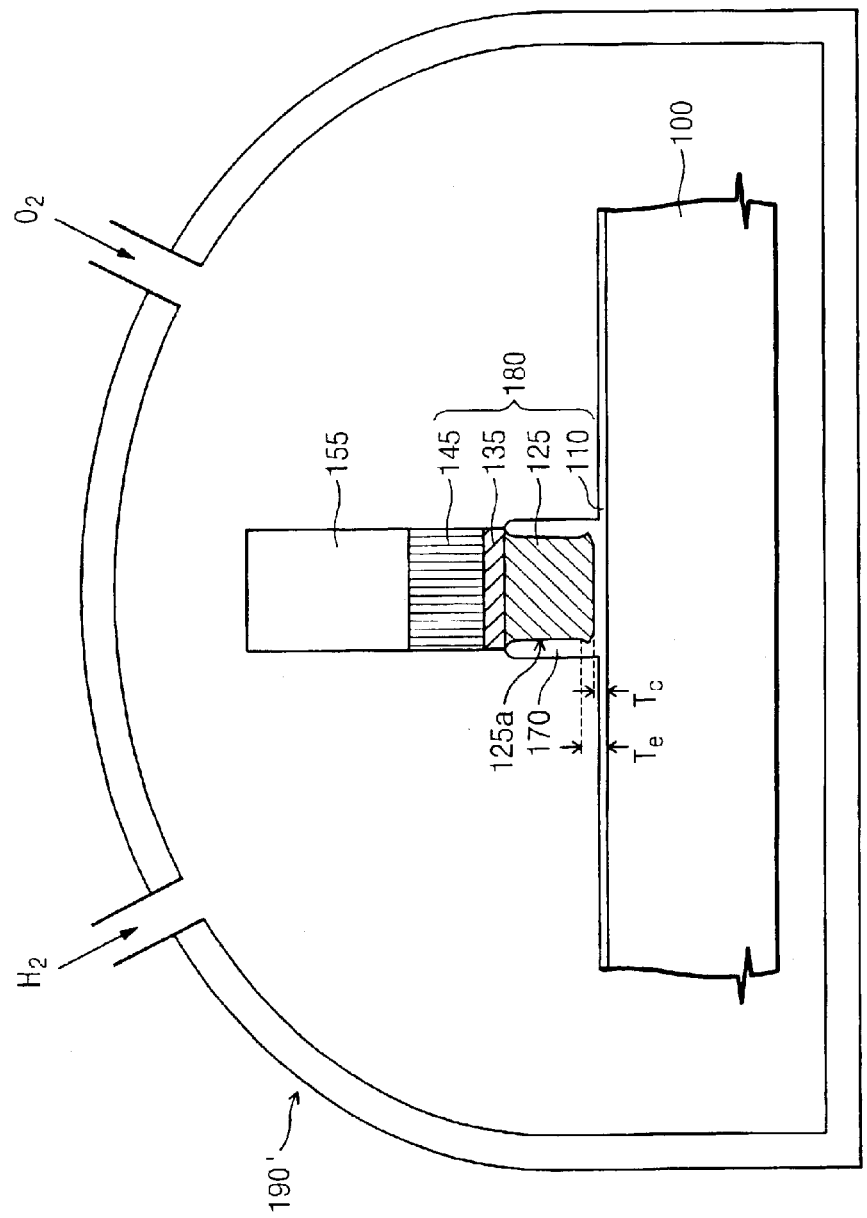

Referring now to FIG. 7, after performing the pretreatment in an atmosphere comprising hydrogen and nitrogen gasses (also referred to as a first atmosphere), a conventional selective oxidation process may be performed by treating the insulated gate 180 in an atmosphere comprising hydrogen and oxygen (O$_2$) gasses (also referred to as a second atmosphere). As shown in FIG. 7, in some embodiments this treatment may be performed in a processing apparatus 190' that is the same as or different from the processing apparatus 190 of FIG. 6. The selective oxidation process of FIG. 7 can be configured to reduce etching damage in the insulated gate 180 and/or the substrate 100, without oxidizing the metal layer pattern 145. In some embodiments, the selective oxidation process of FIG. 7 is performed by providing hydrogen and oxygen at a flow rate of about 7.8 slm and about 1.0 slm, respectively. Other gas flows also may be present. Various process parameters, such as pressure, temperature, time and/or gas flow rates may be controlled to provide selective oxidation using techniques well known to those having skill in the art.

As shown in FIG. 7, the sidewalls 125a of the polysilicon pattern 125 are oxidized to form sidewall oxide layers 170 during the selective oxidation process. Moreover, by performing the pretreating of FIG. 6, the growth in thickness of the gate oxide 110 during the oxidizing of FIG. 7 may be reduced or prevented. Moreover, formation of whiskers on a metal pattern 145 during subsequent processing also may be reduced or prevented compared to absence of the pretreating of FIG. 6.

In particular, referring to Table 2, the thickness of a gate oxide 110 is compared when performing embodiments of the present invention, as described in FIG. 6 (second row of Table 2), and using conventional processes which do not employ the processing of FIG. 6 (first row of Table 2). For Table 2, pretreating the insulated gate in an atmosphere comprising hydrogen and nitrogen gasses was performed at about 850° C. and about 760 torr for about 500 seconds, with supplied nitrogen and hydrogen gas flow rates of about 1 slm and about 3 slm, respectively. Apart from this pretreatment, processing was identical. The initial thickness of the gate oxide 110 was 50 Å. It will be understood that the thickness measured in a semiconductor fabrication facility after forming an insulated gate may be different from the thickness measured using tunneling electron microscopy before fabricating the gate. Thus, the data of Table 2 shows the ability to reduce growth in thickness of the gate oxide using embodiments of the present invention, rather than absolute thickness numbers.

TABLE 2

| | thickness of the gate oxide 110 (Å) | | | |
|---|---|---|---|---|
| | line width of the gate (80 nm) | | line width of the gate (200 nm) | |
| method | $T_c$ (center) | $T_e$ (edge) | $T_c$ (center) | $T_e$ (edge) |
| selective oxidation only | 78 | 87 | 46 | 78 |
| pretreatment and selective oxidation | 55 | 70 | 50 | 79 |

Figure 2:
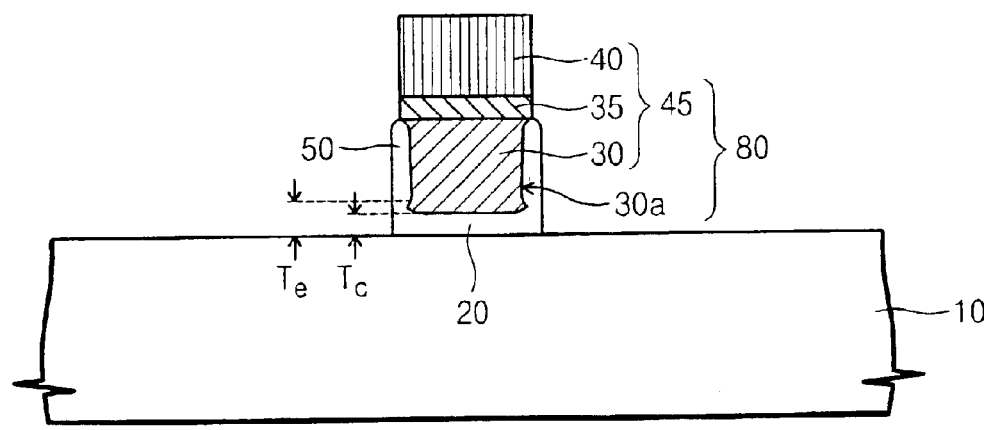
Figure 3:
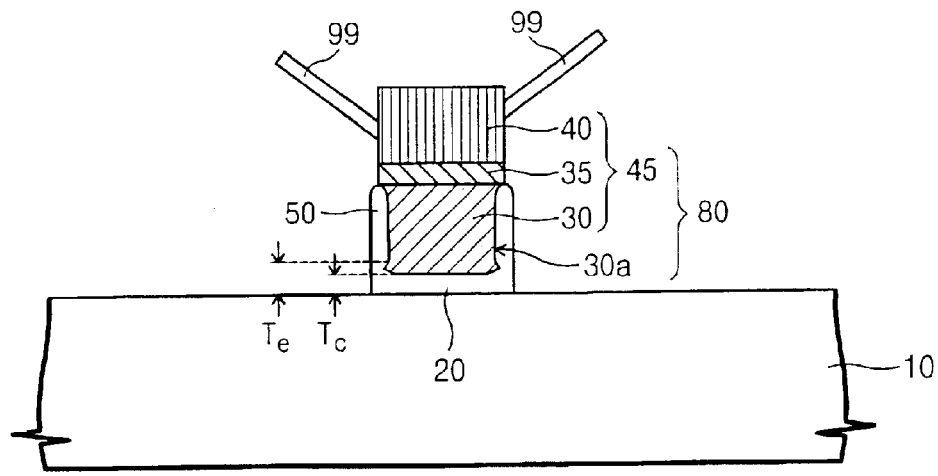

The first row of Table 2 illustrates the use of selective oxidation only in a conventional process of FIGS. 1–3. As shown, in a relatively narrow gate (80 nm), the center thickness increases from about 50 Å to about 78 Å, and the edge thickness increases from about 50 Å to about 87 Å. In a relatively wide gate (200 nm), the center thickness decreases to about 46 Å (the decrease may be due to the different measurement technique and may actually indicate that the thickness remains the same), and increases from about 50 Å to about 78 Å at the edge of the gate.

In sharp contrast, the second row illustrates embodiments of the present invention where a pretreatment in hydrogen and nitrogen gasses is performed, as was illustrated in FIG. 6. As shown in the second row of Table 2, the thickness at the center of the narrow gate increased to about 55 Å, and the edge thickness increased to about 70 Å. For the wide gate, the thickness at the center is unchanged, and the edge thickness increased to 79 Å. Measurement errors of about 10% may be expected for any of these measurements.

Taking this measurement error into account, for a narrow gate, the growth in thickness of the gate oxide at the center of the gate and at the edge of the gate may be reduced, compared to absence of the pretreating. Thus, embodiments of the invention can reduce growth in thickness of the gate oxide as the line width of the insulated gate decreases.

Moreover, some embodiments of the invention can reduce or prevent formation of whiskers on the metal pattern 145 compared to absence of the pretreating. To confirm this effect, a thermal process that can form whiskers was performed after performing the processing of FIG. 7, with and without the processing of FIG. 6. The thermal process that can form whiskers was performed in a nitrogen ambient at 950° C. When processing of FIG. 6 was omitted, whiskers 99 were created, as was shown in FIG. 3. In contrast, when processing of FIG. 6 was performed, whiskers were not formed. Accordingly, pretreating the insulated gate according to embodiments of the invention can reduce or prevent formation of whiskers on the metal pattern, compared to absence of the pretreating.

Accordingly, embodiments of the present invention can pretreat an insulated gate prior to selective oxidation, to reduce the increase in thickness of the gate oxide during the oxidizing and/or to reduce formation of whiskers on the metal pattern during subsequent processing, compared to absence of the pretreating. Thus, highly integrated devices may be produced that are capable of good performance characteristics and/or increased reliability.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating an integrated circuit gate comprising:
   forming an insulated gate on an integrated circuit substrate, the insulated gate comprising a gate oxide on the integrated circuit substrate, a polysilicon pattern including polysilicon sidewalls, on the gate oxide, and a metal pattern on die polysilicon pattern;
   treating the insulated gate in an atmosphere comprising hydrogen and nitrogen gasses; and then
   oxidizing the polysilicon sidewalls.

2. A method according to claim 1 wherein the insulated gate further comprises a metal nitride pattern between the polysilicon pattern and the metal pattern.

3. A method according to claim 1 wherein the metal pattern comprises a tungsten pattern.

4. A method according to claim 1 wherein the treating is performed at between about 100° C. and about 1200° C.

5. A method according to claim 1 wherein the treating is performed at between about 5 torr and about 1000 torr.

6. A method according to claim 1 wherein tire treating is performed for between about 30 seconds and about 1000 seconds.

7. A method according to claim 1 wherein the treating is performed at hydrogen gas flow of between about 0.1 slm and about 100 slm.

8. A method according to claim 1 wherein the treating is performed at nitrogen gas flow of between about 0.1 slm and about 100 slm.

9. A method according to claim 1 wherein the treating and the oxidizing are performed in a single processing apparatus.

10. A method according to claim 1 wherein the treating and the oxidizing are performed in different processing apparatus.

11. A method according to claim 1 wherein the oxidizing comprises:

selectively oxidizing the polysilicon sidewalls without oxidizing the metal pattern.

12. A method of fabricating an integrated circuit gate comprising:

forming an insulated gate on an integrated circuit substrate, the insulated gate comprising a gate oxide on the integrated circuit substrate, a polysilicon pattern on the gate oxide and a metal pattern on the polysilicon pattern;

treating the insulated gate in a first atmosphere comprising hydrogen and nitrogen gasses; and then treating the insulated gate in a second atmosphere comprising hydrogen and oxygen gasses.

13. A method of fabricating an integrated circuit gate comprising:

forming an insulated gate on an integrated circuit substrate, the insulated gate comprising a gate oxide on the integrated circuit substrate, a polysilicon pattern including polysilicon sidewalls, on the gate oxide, and a metal pattern on the polysilicon pattern; and oxidizing the polysilicon sidewalls;

wherein the oxidizing is preceded by pretreating the insulated gate to reduce growth in thickness of the gate oxide during the oxidizing and/or formation of whiskers on the metal pattern, compared to absence of the pretreating.

14. A method according to claim 13 wherein the insulated gate further comprises a metal nitride pattern between die polysilicon pattern and the metal pattern.

15. A method according to claim 13 wherein the metal pattern comprises a tungsten pattern.

16. A method according to claim 13 wherein the pretreating and the oxidizing are performed in a single processing apparatus.

17. A method according to claim 13 wherein the pretreating and the oxidizing are performed in different processing apparatus.

18. A method according to claim 13 wherein the oxidizing comprises:

selectively oxidizing the polysilicon sidewalls without oxidizing the metal pattern.

* * * * *